United States Patent [19]
Grimbergen et al.

[11] Patent Number: 6,081,334
[45] Date of Patent: Jun. 27, 2000

[54] ENDPOINT DETECTION FOR SEMICONDUCTOR PROCESSES

[75] Inventors: Michael N. Grimbergen, Redwood City; Thorsten B. Lill, Sunnyvale, both of Calif.

[73] Assignee: Applied Materials, Inc, Santa Clara, Calif.

[21] Appl. No.: 09/062,520

[22] Filed: Apr. 17, 1998

[51] Int. Cl.$^7$ ................................................ G01B 9/02
[52] U.S. Cl. ................................. 356/357; 356/369
[58] Field of Search .................... 216/60; 356/369, 356/357

[56] References Cited

U.S. PATENT DOCUMENTS

| | | | |
|---|---|---|---|
| 3,612,692 | 10/1971 | Kruppa et al. ............................. | 356/108 |
| 3,824,017 | 7/1974 | Galyon ..................................... | 356/108 |
| 3,874,797 | 4/1975 | Kasai ....................................... | 356/118 |
| 3,985,447 | 10/1976 | Aspnes ..................................... | 356/118 |
| 4,141,780 | 2/1979 | Kleinknecht et al. .................... | 156/626 |
| 4,147,435 | 4/1979 | Habegger ................................. | 356/357 |
| 4,198,261 | 4/1980 | Busta et al. .............................. | 156/626 |
| 4,208,240 | 6/1980 | Latos ....................................... | 156/627 |
| 4,317,698 | 3/1982 | Christol et al. .......................... | 156/626 |
| 4,328,068 | 5/1982 | Curtis ...................................... | 156/626 |
| 4,367,044 | 1/1983 | Booth, Jr. et al. ....................... | 356/357 |
| 4,454,001 | 6/1984 | Sternheim et al. ....................... | 156/626 |
| 4,611,919 | 9/1986 | Brooks, Jr. et al. ...................... | 356/357 |
| 4,618,262 | 10/1986 | Maydan et al. .......................... | 356/357 |
| 4,838,694 | 6/1989 | Betz et al. ................................ | 356/357 |
| 4,846,928 | 7/1989 | Dolins et al. ............................ | 156/626 |
| 4,847,792 | 7/1989 | Barna et al. .............................. | 364/552 |
| 4,861,419 | 8/1989 | Flinchbaugh et al. ................... | 156/626 |
| 4,927,485 | 5/1990 | Cheng et al. ............................. | 156/345 |
| 4,953,982 | 9/1990 | Ebbing et al. ........................... | 356/357 |
| 4,972,072 | 11/1990 | Hauser et al. ............................ | 250/225 |
| 5,131,752 | 7/1992 | Yu et al. .................................. | 356/369 |
| 5,151,584 | 9/1992 | Ebbing et al. ........................... | 250/201.4 |
| 5,362,356 | 11/1994 | Schoenborn ............................. | 156/626 |
| 5,450,205 | 9/1995 | Sawin et al. ............................. | 356/382 |
| 5,499,733 | 3/1996 | Litvak ..................................... | 216/38 |
| 5,503,707 | 4/1996 | Maung et al. ........................... | 156/626.1 |
| 5,564,830 | 10/1996 | Böbel et al. ............................. | 374/126 |
| 5,658,418 | 8/1997 | Coronel et al. .......................... | 156/345 |
| 5,756,400 | 5/1998 | Ye et al. .................................. | 438/710 |

FOREIGN PATENT DOCUMENTS

| | | |
|---|---|---|
| 0511448 | 4/1991 | European Pat. Off. . |
| 0753912 | 7/1996 | European Pat. Off. . |

OTHER PUBLICATIONS

Maynard, et al., "Multiwavelength Ellipsometry for Real–time Process Control of the Plasma Etching of Patterned Samples," *J. Vac. Sci. Technol. B*, 15(1), Jan./Feb. 1997, pp. 109–115.

Klemens, F.P., et al., "High Density Plasma Gate Etching of 0.12 $\mu$m Devices with Sub 1.5 nm Gate–Oxides," *Electrochemical Society Proceedings*, vol. 97–30, pp. 85–95.

U.S. Patent Application entitled, Inductively Coupled RF Plasma Reactor Having an Overhead Solenoidal Antenna; filed May 13, 1996; Ser. No. 08/648,254; Inventors: Collins, et al.; Attorney Docket No. 1115.

U.S. Patent Application entitled, "Closed–Loop Dome Thermal Control Apparatus for a Semiconductor Wafer Processing System"; filed Dec. 16, 1966; Ser. No. 08/767,071; Inventors: Yavelberg, et al.; Attorney Docket No. 1406.

*Primary Examiner*—Robert H. Kim
*Assistant Examiner*—Andrew H. Lee
*Attorney, Agent, or Firm*—Janah and Associates

[57] ABSTRACT

A substrate 20 in a process chamber 42 is processed at process conditions suitable for processing a layer 30 on the substrate 20, the process conditions comprising one or more of process gas composition and flow rates, power levels of process gas energizers, process gas pressure, and substrate temperature. The intensity of a reflected light beam 78 reflected from the layer 30 on the substrate 20 is measured over time, to determine a measured waveform pattern. The measured waveform pattern is compared to a predetermined characteristic waveform pattern, and when the two waveform patterns are similar or substantially the same, the process conditions are changed to change a rate of processing or a process selectivity ratio of the layer 30 on the substrate 20 before the entire layer 30 is completely processed.

34 Claims, 8 Drawing Sheets

ENDPOINT DETECTION FOR SEMICONDUCTOR PROCESSES

BACKGROUND

The present invention relates to a method and apparatus for processing a substrate and detecting an endpoint of a process performed on a substrate.

In integrated circuit fabrication, semiconductor, dielectric, and conductor materials, such as for example, polysilicon, silicon dioxide, and aluminum layers are deposited on a substrate and etched to form patterns of gates, vias, contact holes, or interconnect lines. The layers are typically deposited by chemical vapor deposition, physical vapor deposition, or thermal oxidation processes. In the etching process, a patterned mask layer of photoresist or hard mask is formed on the deposited layer by photolithographic methods, and the exposed portions of the layer are etched by energized halogen gases, such as $Cl_2$, HBr, and $BCl_3$, and which also often include passivating gases, such as $N_2$, which are used to generate passivating deposits on the sidewalls of freshly etched features to provide anisotropic etching.

The process chambers used in the deposition and the etching processes are periodically cleaned to remove residue deposits and contaminants that are formed on the walls, components, and internal surfaces of the chamber, otherwise these deposits flake off and contaminate the substrate. In etching processes, after etching every 100 to 300 wafers, the chamber is opened to the atmosphere and cleaned in a "wet-cleaning" process, in which an operator uses an acid or solvent to scrub off or dissolve accumulated etch residue on the chamber walls. After cleaning, the chamber is pumped down in a vacuum for 2 to 3 hours to outgas volatile species, and a series of etching runs are performed on dummy wafers until the chamber provides consistent etching properties. In the competitive semiconductor industry, the downtime of the etching chamber during the cleaning process can substantially increase the cost/substrate and is highly undesirable. Also, because the wet cleaning process is manually performed, the cleanliness of the chamber surfaces often vary from one cleaning session to another. Thus it is desirable to have a semiconductor process that reduces or eliminates the residue deposits that are formed on the surfaces inside the chamber.

Another problem with conventional etching processes arises because it is difficult to etch very thin layers on the substrate because the etching processes can uncontrollably etch through the thin layer and damage the underlying layer. Especially for silicon oxide (gate oxide) dielectric layers, it is desirable for the remaining thickness of the dielectric layer to be close to a nominal value and for the etching process not to damage the underlying polysilicon or silicon. The gate oxide layer is becoming thinner and thinner in high speed integrated circuits, making it more difficult to accurately etch through the overlying polysilicon layer without overetching into the gate oxide layer, particularly when halogen and fluorine containing gases (that etch through polysilicon with high etch rates) are used. It is desirable to stop the etching process on the gate oxide layer because polysilicon can undergo charge damage and lattice structural damage upon exposure to the energetic plasma ions.

Endpoint detection methods are used to measure the endpoint of the etching process to prevent etching through the overlayers by stopping the etching process before the overlayers are etched through. Endpoint measurement techniques include for example, plasma emission analysis in which an emission spectra of a plasma in the chamber is analyzed to determine a change in chemical composition that corresponds to a change in the chemical composition of the layer being etched, as taught in U.S. Pat. No. 4,328,068 which is incorporated herein by reference. However, plasma emission methods detect etching endpoint only after an overlayer having a particular chemical composition is etched through because they rely on the change in chemical compositions in the underlayer to obtain a change in emission spectra. Furthermore, residue deposits that are formed on the emission monitoring window tend to block or selectively filter the optical emission spectra, resulting in endpoint detection errors. In addition, the sensitivity of plasma emission methods are a function of the etch rate and the total area being etched and are difficult to detect for slow etching processes and smaller etch areas, especially for etching of small contact openings.

An endpoint detection system that measures a process endpoint before processing of entire layer is completed is ellipsometry. In this method, a polarized light beam is reflected off the surface of a layer being etched and is analyzed to determine a phase shift and a change in magnitude of the reflected light that occurs upon etching through the layer, as for example disclosed in U.S. Pat. Nos. 3,874,797 and 3,824,017, both of which are incorporated herein by reference. Polarized light filters are used to measure the change in phase of the polarized light beam that is reflected from the surface of the substrate. However, ellipsometry measurements are also more complicated because have need to measure both the magnitude ($\Delta$) and the phase ($\psi$) of the reflected wavelength to monitor changes in the etching process. It is difficult to obtain accurate ellipsometry readings of a patterned wafer surface, as for example, explained in *Multiwavelength Ellipsometry for Real-Time Process Control of the Plasma Etching of Patterned Samples*, Maynard Layadi and Tseng-Chung Li, *J. Vac. Sci. Technol. B.* 15(1), January/February 1997, which concludes that only a light beam having multiple wavelengths will give accurate layer thickness measurements. In addition, residue deposits that are formed on the transparent window of the chamber change the polarization of the light beam passing through the window, giving rise to erroneous measurements in ellipsometric endpoint detection methods.

Yet another problem with prior art endpoint detection methods arises from the method in which the process endpoint is mathematically determine from a process signal. Typically, the time derivative of a measured light signal is compared with that of a reference signal, and a change in derivative of the two signals is computed to determine a measurably different signal condition relative to a prior signal condition. However, a finite time must pass before the change in the derivative of the two signals can be computed or any other different mathematical condition is recognized, causing a time delay in which the thin underlying layers can be etched through, especially for aggressive etchant gas chemistries. The time delay can also result in undesirable charging or lattice damage of the underlying layers, especially for underlying polysilicon layers. Also, if the selected variation in derivative signals is too small, the fabrication process may never be terminated, and if it is too large, the process may be prematurely terminated.

Thus it is desirable to have an endpoint detection method that terminates a semiconductor process as soon as the desired thickness of a layer being processed on the substrate is achieved, and without damaging the underlying layers. It is further desirable to have an endpoint detection system that provides a signal prior to etching through, or deposition of, an entire layer to allow the etching or deposition process to be changed before completion of the process. It is also desirable to have an endpoint measurement system which measures a change in thickness of a layer being processed, with high resolution, low signal to noise ratio, and high reliability, independent of the strength of the light signal from the substrate, or that is transmitted through the chamber windows. It is also desirable to have a semiconductor etching process that can rapidly etch through an overlayer, while generating little or no deposits on the chamber surfaces, even after sequentially processing multiple batches of wafers in the chamber.

SUMMARY

The present invention provides an endpoint measurement method to detect the endpoint of a semiconductor fabrication process, such as an etching, CVD, or PVD process, before termination of processing of a layer on the substrate, and with a high degree of accuracy and repeatability. In one process according to the present invention, a substrate is processed in a process chamber at process conditions suitable for processing a layer on the substrate, the process conditions comprising one or more of gas composition and flow rates, operating power levels of gas energizers, gas pressure, and substrate temperature. During processing of the substrate, an intensity of a light beam reflected from the layer being processed on the substrate is measured, over time, to obtain or determine a measured waveform pattern. The measure waveform pattern is compared to a predetermined characteristic waveform pattern, and when the two waveform patterns are substantially the same, the process conditions are altered to change a rate of processing or a process selectivity ratio of the layer on the substrate, before the entire layer is completely processed.

Preferably, initial experiments are conducted to determine and select a wavelength of an incident light beam that is substantially absorbed and/or reflected from the top surface of the layer in a first thickness, and at least partially reflected from the top and bottom surfaces of a second thickness of the layer that is typically smaller than the first thickness. Thereafter, one or more test substrates are processed, and during each processing sequence, an incident light beam having the selected wavelength is directed onto a layer on a substrate, and the intensity of the reflected light beam is measured over time to obtain a series of waveform spectra of reflected light. From the waveform spectra, a characteristic waveform pattern that is highly repeatable and that is obtained at a particular stage of the process is selected for use in the production process. Preferably, the characteristic waveform pattern comprises a repeatable waveform oscillation occurring immediately prior to a terminal peak or dip in the reflected waveform pattern, the terminal peak or dip corresponding to completion of a stage of processing of the layer.

In an etching process performed according to the present invention, a layer on a substrate is etched substantially without etching or damaging an underlayer. A substrate is placed into a process zone, and first process conditions are maintained in the process zone, the first process conditions including providing an energized process gas in the process zone for etching the layer on the substrate. An incident light beam is directed onto the layer on the substrate to form a reflected light beam after a sufficient thickness of the layer is etched. The intensity of the reflected light beam is the sum of the constructive or destructive interference of a first light beam component reflected from the top surface of the layer and a second light beam component reflected from the bottom surface of the layer. The intensity of the reflected light beam is measured, over time, to obtain a measured waveform pattern, which is compared to a predetermined characteristic waveform pattern to determine a predefined endpoint of the etching process. At the etching endpoint, the first process conditions are changed to second process conditions to change a rate of etching of the layer on the substrate, or to change an etching selectivity ratio relative to an underlayer, before the entire layer is etched through.

Preferably, the first process conditions include a first process gas comprising etchant gas for etching the substrate (thereby depositing etchant residue on the chamber surfaces), and cleaning gas for cleaning the etchant residue deposited on the chamber surfaces. Preferably, the volumetric flow ratio of cleaning gas to etchant gas is selected so that the deposited etchant residue is removed from the chamber surfaces upon completion of the etching process. The second process conditions provide an energized process gas that is substantially absent the cleaning gas to provide more controlled rates of etching of the layer on the substrate. In a preferred version, the etchant gas comprises one or more of $Cl_2$, $N_2$, $O_2$, HBr, or He—$O_2$; and the cleaning gas comprises one or more of $NF_3$, $CF_4$, or $SF_6$. More preferably, the volumetric flow ratio of cleaning gas to etchant gas is from about 1:20 to about 1:1.

In a particularly useful aspect, the present invention comprises a method of etching a silicon-containing layer comprising elemental silicon or silicon compounds, on a substrate. In a first etching stage, an energized process gas is provided in the etching chamber to etch the silicon-containing layer on the substrate, and simultaneously clean the etchant residue formed on the chamber surfaces, the energized process gas comprising an etchant gas selected from the group consisting of $Cl_2$, $N_2$, $O_2$, HBr, and He—$O_2$, and a chamber cleaning gas selected from the group consisting of $NF_3$, $CF_4$, and $SF_6$. The volumetric flow ratio of etchant gas to chamber cleaning gas is selected to remove substantially all the etchant residue formed on the chamber surfaces upon completion of the etching process. In the first stage, the intensity of a light beam reflected from the layers on the substrate is measured to determine a measured waveform pattern which is compared to a predetermined characteristic waveform pattern, and the process conditions are changed from the first stage to a second process stage when the measured waveform pattern is substantially the same as the predetermined characteristic waveform pattern. In the second stage, another energized process gas is provided to the etching chamber to etch the remaining portion of the silicon-containing layer on the substrate, this energized process gas being substantially absent the cleaning gas to reduce the rate of etching of the layer or to increase its etching selectivity relative to the underlayer on the substrate.

DRAWINGS

These and other features, aspects, and advantages of the present invention will be better understood from the following drawings, description and appended claims, which illustrate examples of the invention. While the description and drawings below illustrate exemplary features of the invention, it is to be understood that each of the features can be used in the invention in general, not merely in the context of the particular drawings, and the invention includes any combination of these features.

DESCRIPTION

The endpoint detection system of the present invention is useful for fabricating integrated circuits on semiconductor substrates and is particularly useful for etching semiconductor, dielectric, or conductor layers such as, for example, layers comprising silicon-containing material that contain elemental silicon or silicon compounds. Semiconductor and dielectric layers are often superimposed on one another making it difficult to etch through a thicker overlying silicon-containing layer and stop the etching process without etching through a thinner underlying silicon-containing layer. Dielectric layers include, for example, silicon dioxide, undoped silicate glass, phosphosilicate glass (PSG), borophosphosilicate glass (BPSG), $Si_3N_4$, or TEOS deposited glass; and semiconducting layers include, for example, polysilicon or silicon. Accordingly, the process of the present invention is illustrated in the context of etching silicon-containing layers in the fabrication of a semiconductor device, as generally described in VLSI Technology, Second Edition, Chapter 11, by S. M. Sze, McGraw-Hill Publishing Company (1988), which is incorporated herein by reference. However, the present invention can be used in other processes such as chemical vapor deposition (CVD), physical vapor deposition (PVD), and evaporation, and should not be limited to the examples provided herein.

Figure 1A:
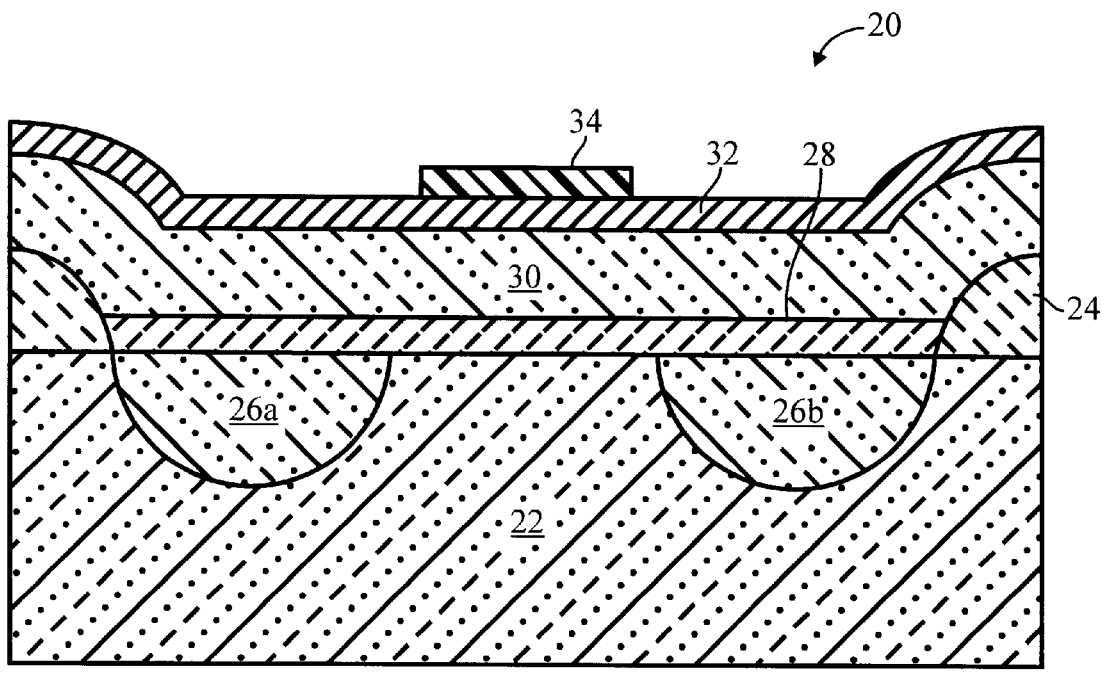
FIGS. 1a and 1b are schematic sectional side views of a typical structure of a substrate that is etched by a process according to the present invention.
Figure 1B:
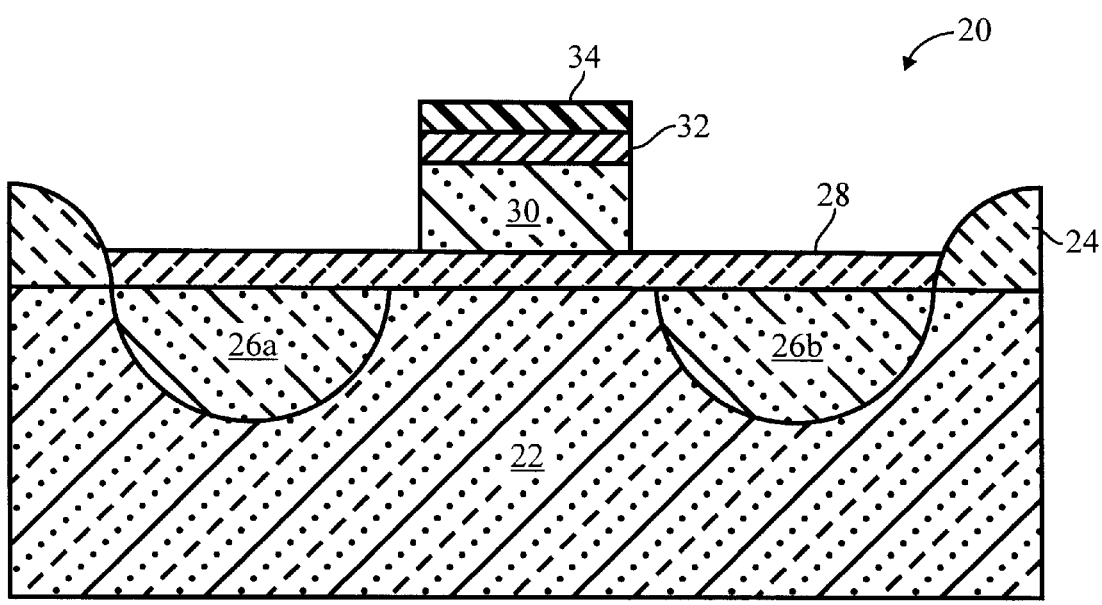

FIGS. 1a and 1b show a typical structure of a substrate 20 that is etched using the present process. The substrate 20 comprises a silicon wafer 22 with silicon oxide barriers 24 surrounding doped silicon regions 26a and 26b. A thin silicon dioxide (gate oxide) layer 28 having a thickness of from about 10 to about 300Å is formed over the substrate. A polysilicon layer 30 and a TiN anti-reflective layer 32 are deposited over the gate oxide layer 28. Patterned resist features 34 comprising photoresist and/or hard mask (typically silicon oxide or silicon nitride) are formed by conventional photolithographic methods to expose portions of the substrate for etching. Preferably, the resist 34 comprises photoresist that is transparent to ultraviolet light frequencies and does not block incident light beams having wavelengths in the ultraviolet range, and more preferably the resist material comprises DUV (deep ultraviolet) resist 34 that is transparent to ultraviolet even at large thicknesses, and is typically used for etching features having dimensions smaller than 0.25 microns.

Figure 2:
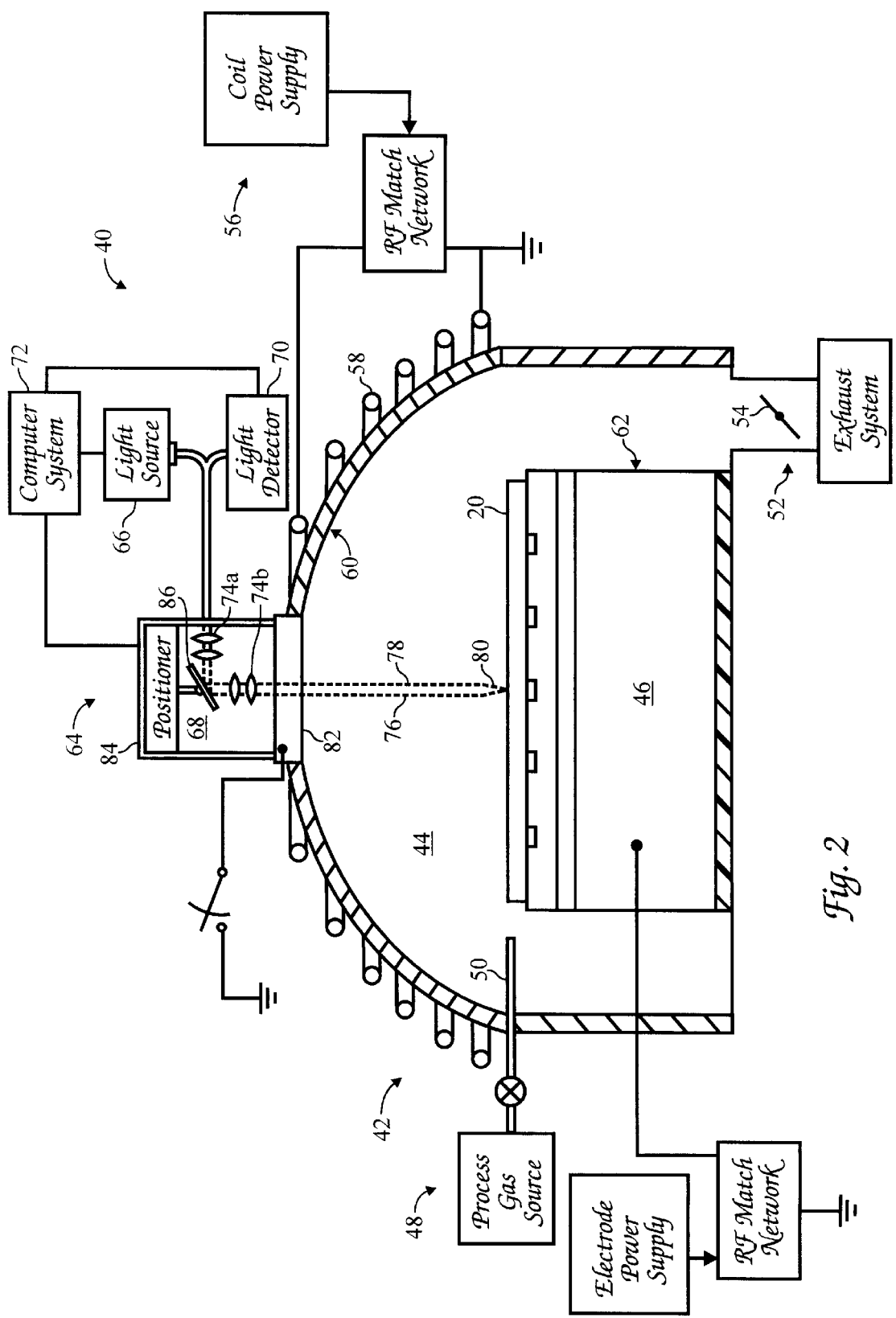
FIG. 2 is a schematic sectional side view of a semiconductor apparatus and endpoint detection system according to the present invention.

The substrate 20 is etched in a semiconductor processing apparatus 40, schematically illustrated in FIG. 2, available from Applied Materials Inc., Santa Clara, Calif., suitable process chambers being described in U.S. patent application Ser. Nos. 08/767,071 and 08/597,445, both of which are incorporated herein by reference. The apparatus 40 comprises a process chamber 42 having a process zone 44 for processing the substrate 20, and a support 46 such as an electrostatic chuck that holds the substrate in the process zone. The process zone 44 surrounds the substrate 20 and comprises a volume of about 10,000 to about 50,000 $cm^3$. The ceiling of the process chamber 42 can be flat or rectangular shaped, arcuate, conical, dome-shaped, or multi-radius dome-shaped. Preferably, the ceiling is dome-shaped to provide a uniform distribution of plasma source power across the entire volume of the process zone 44 and to provide a more uniform plasma ion density across the substrate surface than a flat ceiling.

Process gas is introduced into the chamber 42 through a gas distribution system 48 that includes a process gas supply and a gas flow control system that comprises a gas flow control valve. The gas distribution system 48 can comprise gas outlets 50 located at or around the periphery of the substrate 20 (as shown), or a showerhead mounted on the ceiling of the chamber 42 with outlets therein (not shown). Spent process gas and etchant byproducts are exhausted from the process chamber 42 through an exhaust system (typically including a 1000 liter/sec roughing pump and a 1000 to 2000 liter/sec turbomolecular pump) capable of achieving a minimum pressure of about $10^{-3}$ mTorr in the chamber 42. A throttle valve 54 is provided in the exhaust system 52 to control the flow of spent process gas and the pressure of process gas in the chamber 42.

A plasma is generated from the process gas using a plasma generator 56 that couples an electric field into the process zone 44 of the chamber 42 or in a remote zone adjacent to the process chamber. A suitable plasma generator 56 comprises an inductor antenna 58 consisting of one or more inductor coils having a circular symmetry with a central axis coincident with the longitudinal vertical axis that extends through the center of the chamber 42 and is perpendicular to a plane of the substrate, as described in U.S. patent application Ser. No. 08/648,254, which is incorporated herein by reference. When the inductor antenna 58 is positioned near the dome ceiling, the ceiling of the chamber 42 comprises dielectric material, such as aluminum oxide, which is transparent to RF fields and is also an electrical insulator material. The frequency of the RF voltage applied to the inductor antenna 58 is typically about 50 KHz to about 60 MHZ, and more typically about 13.56 MHZ; and the power level of RF voltage applied to the antenna is about 100 to about 5000 Watts.

In addition to the inductor antenna 58, one or more process electrodes 60, 62 can be used to accelerate or energize the plasma ions in the chamber 42. The process electrodes 60, 62 include a ceiling or sidewalls of the chamber 42 that are electrically grounded or biased to serve as a first electrode 60 that capacitively couples with a second electrode 62 below the substrate 20, to form a capacitive electric field that generates or energizes the plasma in the chamber. Preferably, the first and second electrodes 60, 62 are electrically biased relative to one another by the electrode voltage supply that includes an AC voltage supply for providing a plasma generating RF voltage to the second electrode 62 and a DC voltage supply for providing a chucking voltage to the electrode 60. The AC voltage supply provides an RF generating voltage having one or more frequencies from 13.56 MHZ to 400 KHz at a current power level of about 50 to about 3000 Watts.

The process chamber 42 further comprises an endpoint detection system 64 for detecting an endpoint of a process being performed in the chamber. Generally, the endpoint detection system 64 comprises a light source 66 for emitting a light beam, a focusing assembly 68 for focusing an incident light beam 76 onto the substrate surface, and a light detector 70 that measures an intensity of reflected light beam 78 that is reflected from the substrate surface. A computer 72 calculates portions of the real-time measured waveform spectra of light reflected from a thickness of a layer being processed on the substrate 20 to a stored characteristic waveform pattern and adjusts process conditions in the process chamber 42 when the two waveforms have substantially the same shape and form.

The light source 66 comprises a monochromatic or polychromatic light source that generates an incident light beam 76 having an intensity sufficiently high to provide a reflected light beam 78 that is reflected from a layer on the substrate 20, when the layer is in a suitable thickness, with a measurable intensity. In one version, the light source 66 provides polychromatic light, such as a Hg—Cd lamp, which generates an emission spectrum of light in wavelengths from about 200 to about 600 nanometers. The polychromatic light source 66 can be filtered to provide an incident light beam 76 having selected frequencies, or particular emission spectra wavelengths can be used, or color filters can be placed in front of the light detector 70 to filter out all undesirable wavelengths except the desired wavelength of light, prior to measuring the intensity of the reflected light beam 78 entering the light detector. The light source 66 can also comprise a monochromatic light source that provides a selected wavelength of light, for example, a He—Ne or ND-YAG laser.

One or more convex focusing lenses 74a, 74b are used to focus an incident light beam 76 from the light source 66 as a beam spot 80 on the substrate surface and to focus the reflected light beam 78 back on the active surface of the light detector 70. The size or area of the beam spot 80 should be sufficiently large to compensate for variations in surface topography of the substrate 20 to enable etching of high aspect ratio features having small openings, such as vias or deep narrow trenches. The area of the reflected light beam should be sufficiently large to activate a large portion of the active light detecting surface of the light detector 70. The incident and reflected light beams 76, 78 are directed through a transparent window 82 in the process chamber 42 that allow the light beams to pass in and out of the process environment.

Optionally, a light beam positioner 84 is used to move the incident light beam 76 across the substrate surface to locate a suitable portion of the layer being etched on which to "park" the beam spot 80 to monitor etching process. The light beam positioner 84 comprises one or more primary mirrors 86 that rotate at small angles to deflect the light beam from the light source 66 onto different positions of the substrate surface (as shown). Additional secondary mirrors can be used (not shown) to intercept the reflected light beam 78 that is reflected from the substrate 20 surface and focus the light beam on the light detector 70. In another embodiment, the light beam positioner 84 is used to scan the light beam in a raster pattern across the substrate 20 surface. In this version, the light beam positioner 84 comprises a scanning assembly consisting of a movable stage (not shown) upon which the light source 66, focusing assembly 68, collecting lens, and detector 70 are mounted. The movable stage can be moved through set intervals by a drive mechanism, such as a stepper motor, move the beam spot 80 across the substrate surface.

The light detector 70 comprises a light sensitive electronic component, such as a photovoltaic cell, photodiode, or phototransistor, which provides a signal in response to a measured intensity of the reflected light beam 78 that is reflected from the substrate surface. The signal can be in the form of a change in the level of a current passing through an electrical component or a change in a voltage applied across an electrical component. The reflected light beam 78 undergoes constructive and/or destructive interference which increases or decreases the intensity of the light beam, and the light detector 70 provides an electrical output signal in relation to the measured intensity of the reflected light beam 78. The electrical output signal is plotted as a function of time to provide a waveform spectra having numerous waveform patterns corresponding to the varying intensity of the reflected light beam 78.

A computer program on a computer system 72 compares the shape of the measured waveform pattern of the reflected light beam 78 to a stored characteristic waveform pattern and determines the endpoint of the etching process when the measured waveform pattern is the same as the characteristic waveform pattern. The computer program can also include program code to calculate in real time, the thickness of the layer being etched that remains on the substrate 20 and accordingly adjust the process conditions in the process chamber 42. The computer program can also count the number of maxima and minima peaks in the intensity of the reflected light beam 78 and, after a predetermined number of peaks are reached, alter process conditions in the chamber 42, according to programmed guidelines.

Etching and Endpoint Detection Process

An example of a substrate processing and endpoint detection method according to the present invention will now be described, with reference to an exemplary etching process, in which a polysilicon overlayer 30 on a gate oxide (silicon dioxide) underlayer 28, is etched without etching or damaging the underlayer. The substrate 20 is transferred by a robot arm from a load-lock transfer chamber 42 through a slit valve and into a process zone 44 of the chamber. The substrate 20 is held on the support 46 by an electrostatic chuck and helium is supplied through apertures in the chuck to control the temperature of the substrate. Thereafter, the process conditions in the process chamber 42 are set to process the layer on the substrate 20, the process conditions comprising one or more of process gas composition and flow rates, power levels of gas energizers, gas pressure, and substrate temperature. The process can also be performed in multiple stages, for example, each stage having different process conditions. For example, in an etching process, one or more compositions of process gas comprising etchant gas for etching the substrate 20 are introduced into the chamber 42 through the gas distributor. Suitable etchant gases for etching layers on the substrate 20, include for example, HCl, $BCl_3$, HBr, $Br_2$, $Cl_2$, $CCl_4$, $SiCl_4$, $SF_6$, F, $NF_3$, HF, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, $CFCl_3$, $O_2$, He, and mixtures thereof. The chamber 42 is typically maintained at a pressure ranging from about 0.1 to about 400 mTorr. The etchant gas composition is selected to provide high etch rates and/or high etching selectivity ratios for etching the overlayer relative to the underlayer. When multiple layers are being sequential etched, first, second, third, etchant gas compositions can be sequentially introduced into the chamber 42 to etch each particular layer.

The process gas in the process zone 44 is energized and maintained at first process conditions suitable for etching a layer on the substrate 20. Referring to FIG. 2, a plasma is energized from the etchant gas using the plasma generator 56 by inductively and/or capacitively coupling energy into the process zone 44 of the chamber 42, or by applying microwaves to an etchant gas in a remote zone of a remote chamber (not shown) that is at a location remote from the process zone. By energized process gas, it is meant that the process gas is activated or energized so that one or more of dissociated species, non-dissociated species, ionic species, and/or neutral species are excited to higher energy states in which they are more chemically reactive. Preferably, the process gas is energized by applying an RF source current to the inductor antenna 58 encircling the chamber 42 or by applying an RF bias voltage to the process electrodes 60, 62. The etchant gas ionizes in the applied electric field to form ions and neutrals that etch the layer on the substrate 20 to form volatile gaseous species that are exhausted from the chamber 42.

To precisely change process conditions, after a given thickness of the layer is processed, an endpoint detection method is used to detect the thickness of the layer and change process conditions in the chamber 42. In etching processes, the endpoint detection method can be used to change the process gas composition to provide particular etching rates or etching selectivity ratios. For example, the endpoint detection method can be used to stop the etching process after a first highly aggressive etching step, which provides high etch rates due to the presence of the fluorinated gas in the etchant gas, to determine the starting point for a second and less reactive etching step, which uses a process gas that is absent the fluorinated gas to etch the remaining dielectric layer at a slower etch rate to obtain more controlled etching. The endpoint detection system 64 is used to detect the time at which almost all of the silicon layer is etched so that the first process conditions can be changed to less aggressive or second process conditions, or vice versa, to obtain the desired change in etching rate, etching selectivity ratio, or a change in any other property of the etching process, for example, higher/lower etching rates, or etching of underlying layers having a different composition.

Generally, in the endpoint detection method, radiation as schematically represented by an incident light beam 76 is transmitted through the energized process gas in the process zone 44 of the process chamber 42, to be incident on the layers covering the substrate 20 while the layers are being processed or etched. When the thickness of the layer 30 is sufficiently low (after etching for a period of time) the intensity of the reflected light beam 78 that reflects off both the top and bottom surfaces of the layer 30 on the substrate 20 is measured and plotted over time to obtain a measured waveform pattern. The measured waveform pattern is compared to a predetermined characteristic waveform pattern to determine an endpoint of the etching process that occurs when the two waveforms are the same or substantially identical to one another. Upon detection of the endpoint, the first process conditions are changed to second process conditions to change the rate of etching of the layer 30 on the substrate 20, or to change its etching selectivity ratio relative to the underlayer 22, before the entire layer 30 is etched through.

Figure 3A:
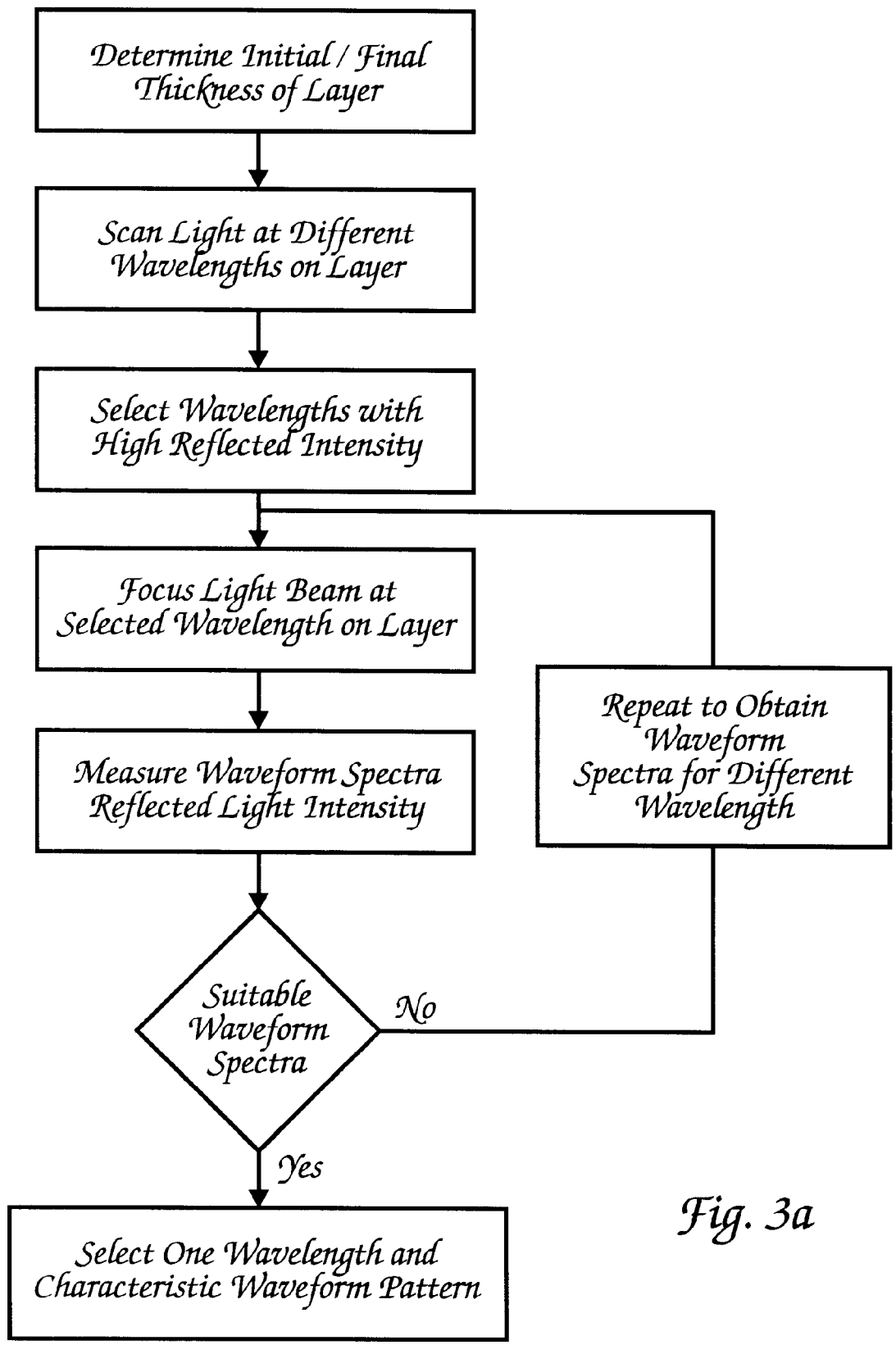
FIG. 3a is a flowchart of the process steps used to determine a characteristic waveform pattern during processing of a substrate.

Preliminary experiments are conducted, as shown in flowchart of FIG. 3a, to identify a wavelength of light that is suitable for providing desired absorption or reflection characteristics, and to select a characteristic waveform pattern of reflected light of an incident beam having the selected wavelength that occurs during processing of the substrate 20. Initially, a reflectance thickness measuring machine is used to accurately determine the initial thickness of the layer to be etched on the substrate 20, such as a model UV1050 available from KLA-TENCOR, Santa Clara, Calif. The actual layer thickness is useful to estimate the overall operation time of the etching process and/or to calculate the thickness of the layer that should be etched to provide a predetermined thickness of the layer that remains on the substrate 20 after the etching process.

Thereafter, a particular wavelength of incident light is selected to operate the endpoint detection process. Preferably, the incident light beam comprises substantially only certain dominant wavelengths or a single wavelength of visible light (or the light beam is filtered to obtain dominant wavelengths or a single wavelength), to provide a discernible waveform spectra and a high intensity characteristic waveform pattern. For example, the wavelength preferably corresponds to a high intensity wavelength of an emission spectra of the light source 66. In addition, it is also preferred for the incident light beam to consist of substantially only non-polarized light. Polarized light is preferentially absorbed by a change in the characteristics of the plasma in the chamber or the chamber window. For example, deposition of a thin residue on a chamber window can change the absorption characteristics of the chamber window, resulting in preferential absorption of polarized light. It is preferred to use non-polarized light to reduce or prevent such changes in the intensity of the reflected light to reduce errors in the measurement or comparison of waveform patterns of the light.

Figure 4A:
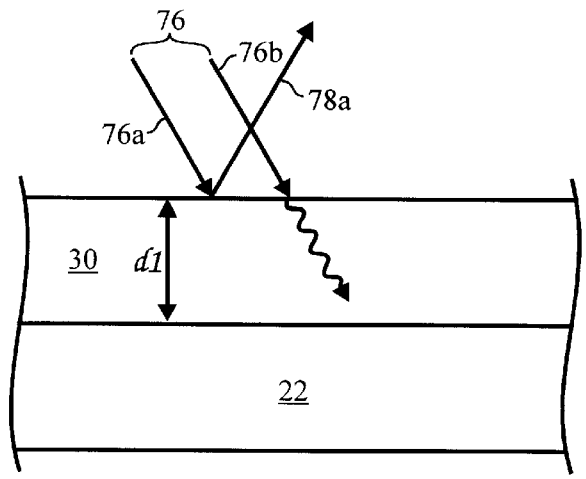
FIGS. 4a to 4c are schematic views of an incident light beam having a wavelength that is absorbed (or reflected from the top surface) of a thick layer on the substrate and reflected from the top and bottom surfaces of the partially processed or etched thinner layer.
Figure 4B:
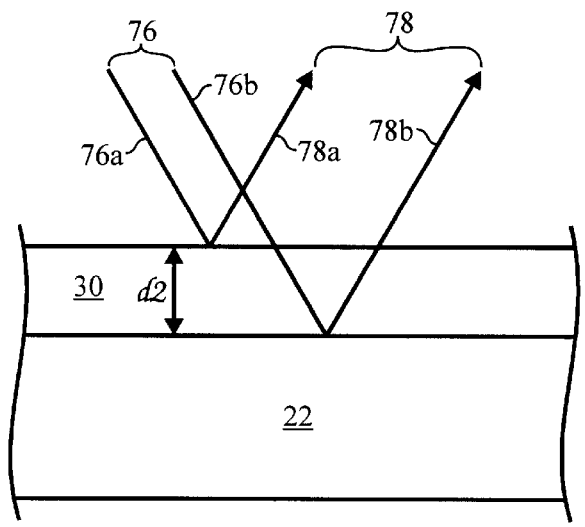

A light beam 76 (schematically represented by two components 76a and 76b) having The selected wavelength of light should be partially absorbed and patially reflected from the top surface of the layer 30, when incident on the layer 30 having a first thickness, as shown in FIG. 4a. The selected wavelength should also be at least partially reflected from the interface of the layer 22 and the layer 30, as shown in FIG. 4b, when the layer 30 is partially etched and is much thinner and more transparent. As the thickness of the layer 30 deceases during the etching process, the remaining thickness of the layer 30 becomes transparent to particular wavelengths of incident light 76. Referring to FIG. 4b, when the layer 30 is etched (or otherwise processed) to transparent thickness levels, a first component 76a or portion of the incident light is reflected from the top surface of the beam, and a second component 76b or portion of the incident light beam enters the layer 30, and is refracted through the thickness of the layer and reflected back upwards from the bottom surface of the layer 30. While other reflections and refractions of the incident light also occur, in a simplified representation, the transparent layer reflects a first component 76a of the light beam from the top surface of the overlayer 30 and a second component 76b of the light beam from the top surface of the underlayer 22. The first and second light beam components are formed only after a sufficient thickness of the layer 30 is etched or deposited, and they constructively or destructively interfere to form the reflected light beam.

A suitable wavelength depends upon the emission spectra of the light source 66 and the optical properties of the layer 30 (and the layer 22) on the substrate. For example, FIG. 4 is a graph of the peak intensities of reflected light obtained for an incident light beam from am Hg lamp, that are reflected from a thin polysilicon layer 30 having a thickness of about 500 nanometers superimposed on a 100 nanometer silicon dioxide underlayer 22.

The peaks on the graph represent the interaction between the light provided at different emission spectrum wavelengths of the Hg lamp, and the layers 22, 30 on the substrate 20. For example, the intensity of the peaks at wavelengths exceeding 365 nm is much higher than the peak intensities at the lower wavelengths of 254 or 313 nm. The wavelengths exhibiting the higher peaks are selected because a higher intensity provides a lower error level due to the higher signal to noise ratio of the reflected waveform spectra. The optimal wavelengths depend upon the composition of the layer to be etched, and the initial and final thicknesses of the etched layer, and therefore, an empirical determination of the wavelength is desirable. In this example, the wavelengths of 254, 313, 365, 405, 436, and 546 were selected for testing and evaluating of the shape and features of their reflected waveform spectra.

To evaluate the reflected waveform spectrum, a batch of substrates were etched in the etching chamber 42 using the same process conditions used in the actual etching process. As each substrate 20 was being etched, a particular wavelength of incident light 76 was directed on the substrate 20 and the reflected (or absorbed) waveform spectra of the reflected light beam 78 was monitored by the light detector 70. These experiments were conducted using a light source 66 consisting of a Hg—Cd lamp. A light beam from this light source is focused on the substrate 20 at a near vertical angle, to provide a beam spot 80 having a size sufficiently large to cover one or more of the features being etched on the substrate 20. The intensity of the reflected light beam 78 is measured over time to obtain a measured waveform pattern.

Figure 4C:
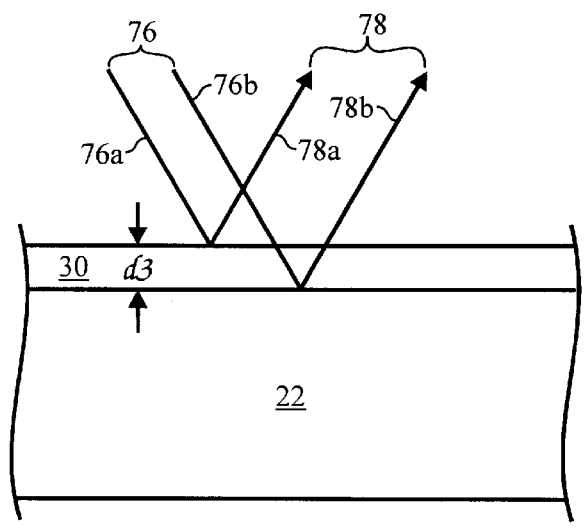
Figure 5:
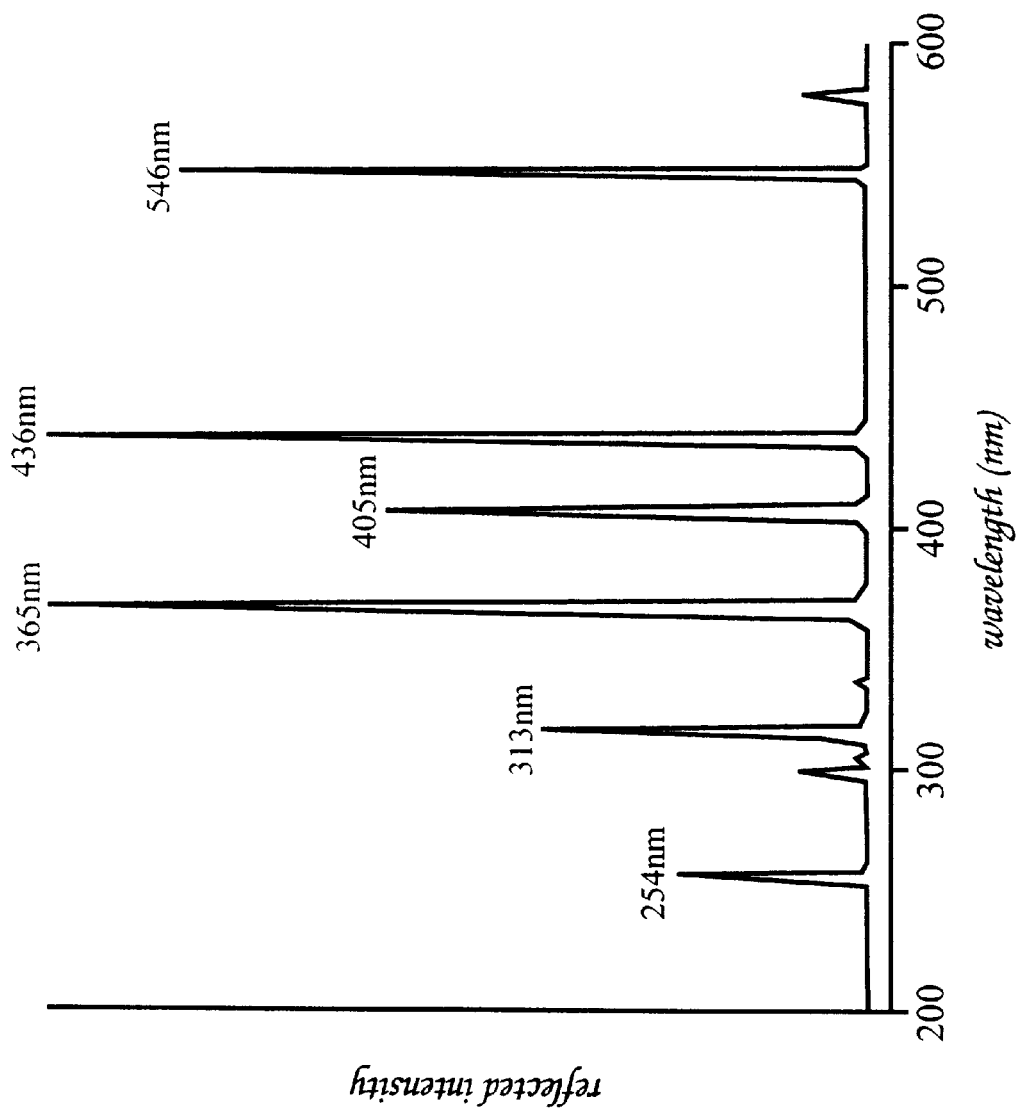
FIG. 5 is a graph of the peak intensities of a light beam reflected from a layer on a substrate that shows peaks at different wavelengths of the emission spectra of a Hg lamp.

In the etching process, the light beam 76 is initially partially reflected from and partially absorbed in the layer 30 when the layer thickness is sufficiently large to render the layer at least partially absorptive of the incident light beam 76, as shown in FIG. 4a. Thereafter, a portion of the incident light is continued to be reflected from the top surface of the beam, and another portion of the incident light beam that enters the layer 30 and is refracted through the thickness of the layer and reflected back upwards from the bottom surface of the layer 30. The intensity of the reflected light beam 78 varies periodically with the thickness of the layer 30 and its period spacing depends on the wavelength of the incident light beam 76. Generally, the periodic oscillations of the reflected waveform pattern increase in amplitude as the thickness of the layer 30 approaches diminishing values, i.e., close to the interface of the layer and the underlayer. This occurs because the intensity of the reflected light beam 78 is dependent upon the phase relationship of its constituent light beams 78a, 78b, which in turn are dependent upon the diminishing path length d through the diminishing thickness of the etched layer 30, as shown in FIGS. 4b and 4c. The intensity of the reflected light beam 78 which is given by the sum of the first and second reflected components 78a, 78b of the light beam, undergoes periodic maxima and minima (as for example illustrated in FIG. 5).

The interference phenomenon is described by the equation, $2d=N(\lambda/\eta)$, where $\lambda$ is the wavelength of the laser light, $\eta$ is the refractive index of a layer, and d is the thickness of the layer. For integral values N=1,2,3 etc., the interference is constructive and intensity of the reflected light is at a maximum. For N=⅓, 3/2, 5/2, etc., the interference is destructive and the intensity of the reflected light beam is at a minimum value.

In a more precise definition of the absorption and transmittance characteristics of the optical interferometric wavelength, when an optically absorbing thin film layer 30 (medium 1) lies on another layer 22 (medium 2), its reflectivity can be approximately described by a summation method. Generally, the radiation in the process environment (medium zero) in the chamber that is incident on the layer 30 (medium 1) has a first surface reflection determined by the complex Fresnel coefficient $r_1=(n_0-n_1)/(n_0+n_1)$ where $n_0$ and $n_1$ are the complex refractive indices of media 0 and 1. The complex refractive index n is defined as $n=-ik$ where n and k are the real and imaginary parts, being the refractive index and extinction coefficient, respectively. Radiation not reflected by the layer 30 is transmitted into the layer 30 according to the complex Fresnel transmission coefficient $t_1=2n_0/(n_0+n_1)$. Transmitted radiation is then absorbed in the layer 30 (medium 1) as a function of its depth d by the factor $\exp(-4k_1d/\lambda)$ where $\lambda$ is the wavelength of the incident radiation. If the incident radiation has not been fully absorbed before reaching the rear of the layer 30 some of the radiation is reflected back according to the equation, $r_2=(n_1-n_2)/(n_1+n_2)$, where $n_2$ is the complex refractive index for layer 22 (medium 2). The part of the reflection which remains after absorption is transmitted back into medium 0, where it combines with the original reflection, but with a phase change defined $d_1=2\pi n_1 d_1/\lambda$ by the round trip distance covered. The net reflected amplitude is approximately, $r_{net}=r_1+t_1t_1'r_2 \exp(-2id_1)$, where multiple reflections have been neglected. When $d_1$ and $k_1$ are large enough, absorption dominates and the second term is zero, producing a constant net reflection as a function of thickness $d_1$. Once $d_1$ becomes small enough, however, absorption no longer dominates and the net reflection is no longer constant as $d_1$ is varied. This variation comes from the changing phase of the second term as $d_1$ is changed. Depending on the magnitude of $k_1$, the variation in reflectivity with $d_1$ can appear periodic, with an increasing amplitude as $d_1$ tends to zero, or simply have a characteristic signature. More complex layer systems exhibit the same behavior and can be more precisely modeled using a characteristic matrix approach in which each layer 30 in a multilayer thin film stack is represented by a 2×2 mathematical matrix, and is used to calculate the total reflectivity of the stack. Lateral differences in the multilayer stack arising from patterning can also be accounted for by summing the complex reflected amplitudes vectorially (with phase) from each stack to determine the total reflected intensity from the patterned multilayer system.

Figure 6:
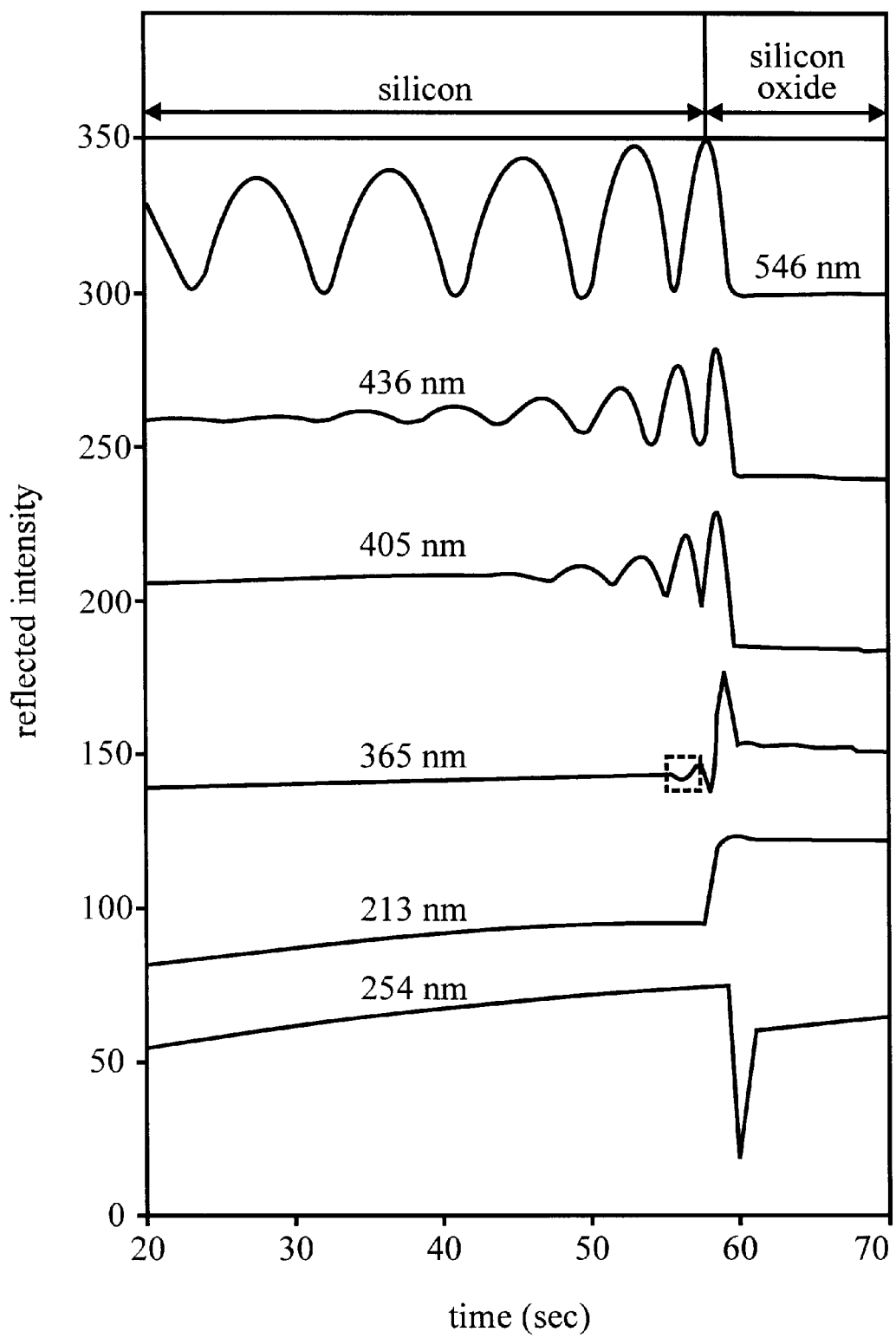
FIG. 6 is a graph showing the waveform spectra of reflected light beams at different wavelengths during etching of a layer on the substrate.

From the waveform spectra obtained, as illustrated in FIG. 6, a particular wavelength of incident light is selected depending on the periodicity of its associated waveform spectra as a function of decreasing thicknesses of the etched layer. The waveform spectra comprises multiple waveform oscillations for higher wavelengths, and at certain wavelengths, provides a sufficient number of periodic oscillation peaks, to accurately select a characteristic waveform pattern for endpoint detection. For example, at wavelengths of 254 nm, the intensity of the reflected light beam 78 shows only a single valley before the end of the etching process, and at 313 nm the intensity of the reflected light beam 78 provides a single peak, both of which are not preferred. Thus wavelengths in the lower range of 254 nm to 313 nm are undesirable because they provide too few wavelengths. The 365 nm wavelength provides two distinct peaks each having a shape that is easily recognizable. At wavelengths above 405 nm, a larger number of peaks is obtained, which is less desirable. At 546 nm, the multiple peaks render the waveform spectra undesirable, because each of the peaks have to be "recognized" by the computer program, and this can result in a larger number of endpoint detection errors.

Generally, it is preferred to use a simple spectra with one or two peaks that are easily recognizable, and that require less storage or analysis of multiple peaks or other waveform oscillation shapes. Therefore, suitable waveform spectra (from this set of waveform spectra) are provided at the 365 nm and 405 nm wavelengths, both spectra exhibiting a small number of oscillations that rapidly increase from a minima to a maxima, in about 5 to about 7 visible peaks. Thus for the etching of polysilicon layers 30, it has been discovered that a preferred wavelength is less than about 600 nm, more preferably from about 200 nm to about 600 nm, and in this case, most preferably either 365 or 405 nm.

Once a particular wavelength and associate waveform spectra are empirically determined, a particular waveform pattern is chosen that provides an easily characterizable waveform pattern, immediately prior to termination of etching of the polysilicon layer 30, and at the time the remaining thickness of the etched layer 30 approaches a preselected endpoint thickness. The characteristic waveform pattern should have a shape or oscillation that is relatively easily recognizable by the computer system program and that provides low errors in endpoint detection. The characteristic waveform pattern should also have distinct features that will be easily recognizable to the computer system 72 even if the reflected light beam is attenuated or has a high signal to noise ratio. The shape recognition properties also depend upon the structure of the comparative programming code module of the computer program and the sensitivity of the light detector 70. In addition, the characteristic waveform should be sufficiently repeatable, from one substrate 20 to another, to reduce endpoint detection errors when processing a large batch of substrates.

Preferably, the characteristic waveform pattern comprises a repeatable waveform oscillation pattern that occurs immediately prior to a terminal peak or dip in the reflected waveform pattern shape that corresponds to or denotes a completed stage of etching of the layer. Typically, the characteristic waveform pattern is chosen to be one that occurs when only a small thickness of the layer 30 that is being etched still remains on the substrate 20. For example, a selected characteristic waveform for the 365 nm wavelength spectra is shown in the inset box of FIG. 6. During a production etching processes, the waveform spectra that is measured in real time is compared to the predetermined characteristic waveform spectra, and the etching process is stopped or process conditions are changed, when the characteristic waveform pattern signal of inset box is detected. Also, because the initial thickness of the layer, the wavelength of the incident light beam 76, and the periodicity of the intensity of the reflected light beams are all known, the characteristic waveform pattern can be used to calculate a remaining thickness of the layer and used to stop or change the etching process at some predetermined layer thickness. Typically, for the etching of polysilicon layers 30 in the fabrication of gate oxide structures, the etching process is stopped when the residual layer thickness is less than about 500 Å, and more typically from about 200 to about 1000 Å.

Figure 7A:
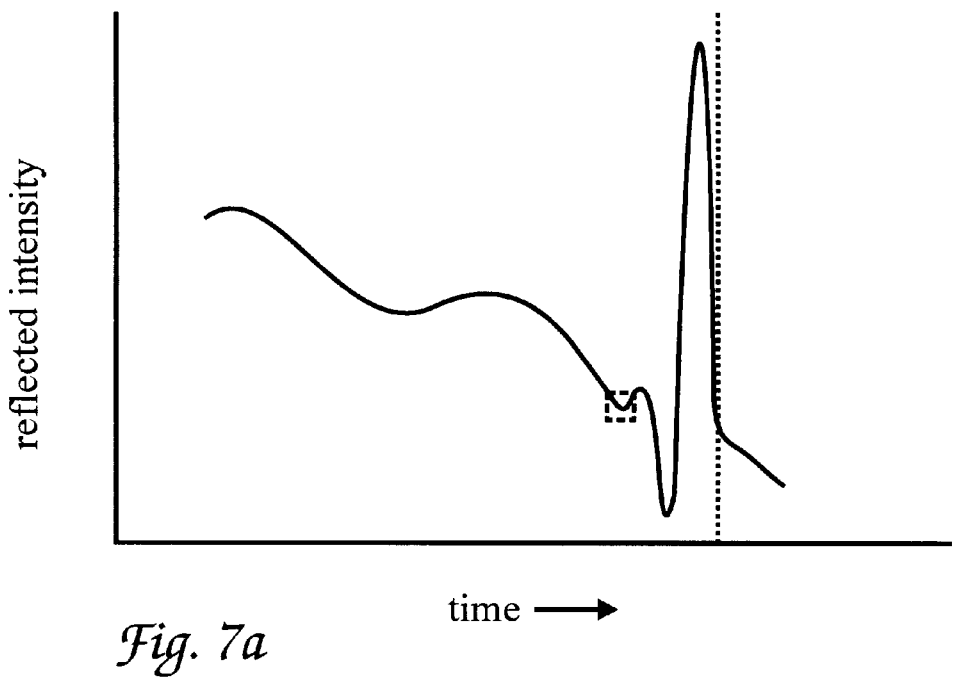
FIGS. 7a and 7b show waveform spectra and selected characteristic waveform patterns for two different configurations of layers on substrates.
Figure 7B:
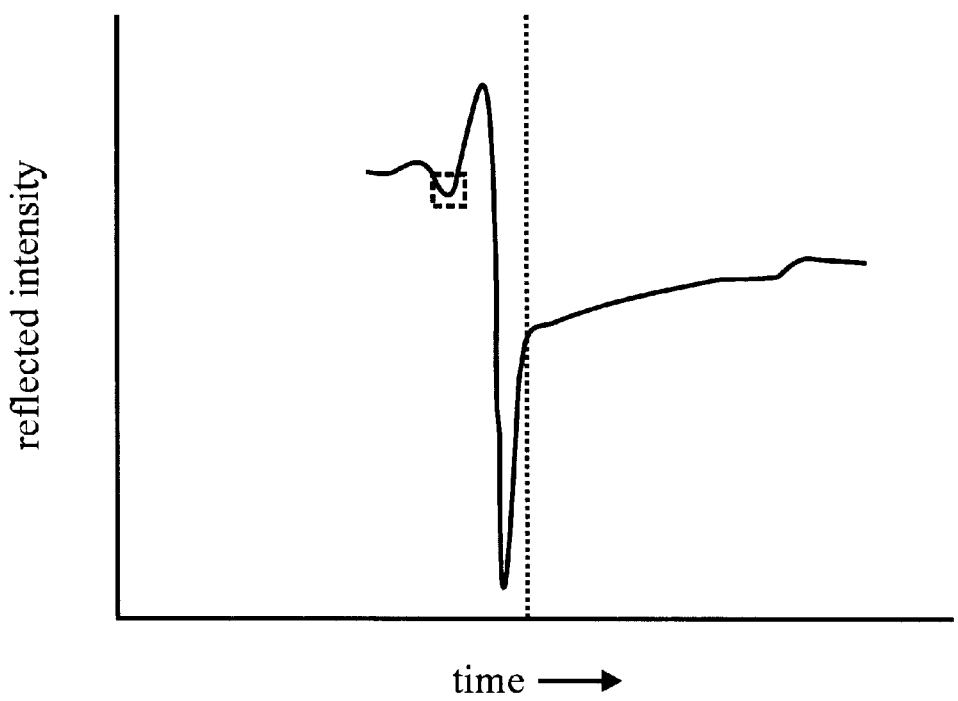

FIGS. 7a and 7b show a portion of a waveform spectra of a reflected light beam 78 (at a wavelength of 365 nm) that is close to the interface of a polysilicon layer 30 deposited on a silicon oxide layer 22. FIG. 7a is the spectra obtained for a substrate 20 with a patterned i-line resist layer 34 over a 5000 Å thickness of polysilicon 30 that overlies a relatively thick 1000 Å layer of silicon dioxide 22. In FIG. 7a, the preselected characteristic waveform is the small dip that occurs before the small peak which is immediately in front of a large peak. The small dip is easily recognizable and programmable by conventional shape recognition computer programs. FIG. 7b is the spectra obtained for a substrate 20 with a patterned i-line resist layer 34 over a 2000 Å thickness of undoped polysilicon 30 that overlies a very thin 65 Å layer of silicon dioxide. In FIG. 7b, the characteristic waveform pattern is a small dip in front of a relatively large peak signal, that is also highly recognizable and was highly repeatable.

Figure 3B:
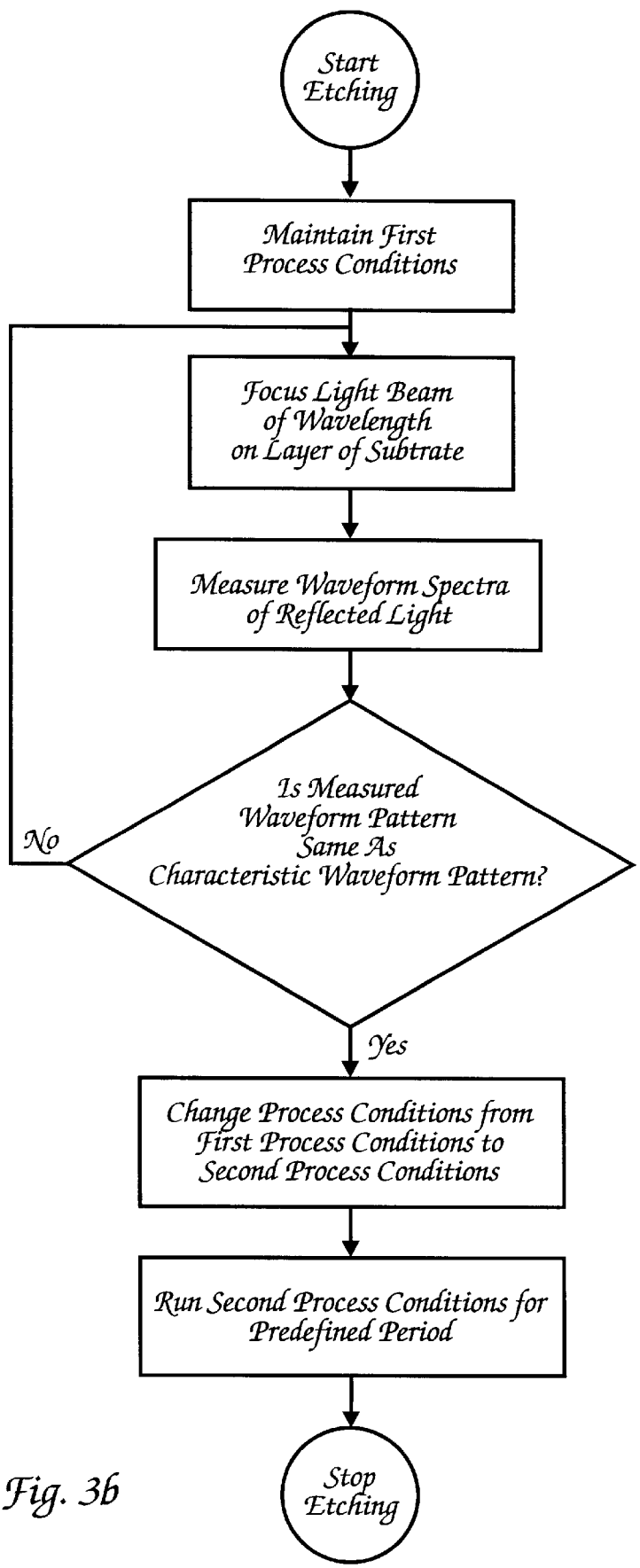
FIG. 3b is a flowchart of the process steps used to etch a silicon-containing layer, measure the etching endpoint, and change from first to second process conditions.

The shape and location of the characteristic waveform pattern is programmed into the computer code of the computer system 72 that operates the endpoint detection and processing system 64 of the present invention. In the etching process, as represented by the flow chart of FIG. 3b, the endpoint detection system 64 is used to continuously measure the thickness, in-situ, of a layer on a substrate 20 that is being processed in the chamber 42. During the etching process, a light beam having the selected wavelength is focused on the substrate 20 and the intensity of the reflected light is measured by the light detector 70. A polychromatic light source 66 is filtered with an appropriate set of filters or a monochromatic laser is focused on the substrate 20 to obtain an incident light beam spot 80 of the desired wavelength and size on the substrate. The intensity of the reflected light beam 78 is measured, over time, by the light detector 70 during the entire etching process to obtain a measured reflected waveform spectra. When a waveform pattern of the measured waveform spectra was the same as the programmed characteristic waveform pattern, the etching endpoint was detected by the computer system 72. At this stage, etching had proceeded to near completion, i.e., with about 300 Å of silicon layer remaining on the substrate 20, and the first process conditions were changed to second process conditions to reduce the etching rate to provide a more controlled etching of the overlayer and increase etching selectivity ratio for etching the polysilicon layer 30 relative to the underlying silicon dioxide layer. The etch rate can be reduced by changing the composition of the process gas to remove aggressive etchant gases, lower the RF bias power levels, lower the substrate temperature, etc.

The etching and endpoint detection method of the present invention can significantly improve substrate yields by reducing etching or other damage of the thin gate oxide underlayer 28, during etching of an overlying polysilicon layer 30. In particular, the polysilicon etching process was stopped without etching through an ultra-thin gate oxide layer having a thickness of 25 to 65 angstroms, which is only a few layers of atoms of silicon dioxide, and which is 4 to 5 times thinner than prior art gate oxide layers. The etching method also minimizes the damage that a high density RF bias plasma can cause by the formation of damaging electrical currents that are coupled through the thin gate oxide layer 28 into the silicon wafer. Also, by stopping the etching process before the thin gate oxide layer is damaged by the aggressive etching process step, the present process provides higher yields and better quality of integrated circuits.

Moreover, the endpoint detection method of the present invention is preferred over ellipsometry or plasma emission methods. The present method of comparing a shape of a measured waveform pattern to a shape of a characteristic waveform pattern to identify an etching endpoint stage is far more accurate. The present method is also more tolerant to the formation of etchant deposit layers on the transparent window 82, which simply reduce the overall intensity of the reflected light beam 78, but still allow detection of the relative change in intensity of the reflected light beam 78. Also, the shape of the characteristic waveform method does not change even if the intensity of the reflected light is reduced due to filtering or absorption by deposits formed on the transparent window 82 of the chamber 42. The deposits formed on the chamber windows 82 also do not effect the endpoint detection method, because the intensity of the reflected light in independent of the state of polarization of the light beam (which is measured in ellipsometry). Furthermore, a single wavelength of non-polarized light is adequate to measure and determine the etching endpoint, thereby reducing the complexity of light sources and detectors which are used to measure the intensity and phase shift of multiple wavelengths of light that are required in ellipsometry.

Cleaning and Etching Process

In another aspect of the present invention, a chamber cleaning process is performed in conjunction with the etching process. In a preferred version, a first layer on a substrate is etched in a first stage of the etching process, by a process gas comprising a composition of etchant gas that provides a high etching rate and a chamber cleaning gas that cleans the etchant residue formed on the walls of the chamber. An etching endpoint is detected immediately prior to etching through the first layer, and the composition of the process gas is changed in a second stage of the process to remove the cleaning gas to etch the remaining portion of the first layer without damaging the underlying second layer. The cleaning gas in the first stage of the process cleans the etching chamber without requiring stopping etching in between processing of batches of substrates to perform wet cleaning processes.

Instead of in the first stage, the cleaning gas can also be added to the process gas in any etching stage that is used to etch through a particular layer on the substrate. For example, multiple stage etching processes can be used to etch stacked layers of different materials on the substrate. In these processes, the cleaning gas is introduced in at least one of the stages to remove the etchant residue deposited on the chamber surfaces during all of the preceding or succeeding stages. The multiple stage process is useful for etching polycide structures that comprise multiple layers of tungsten silicide and polysilicon layers or for etching silicon nitride layers or silicon dioxide layers on silicon wafers. Although the multiple stage process is illustrated in the context of etching such layers, it should be understood that the process can be used to etch other layers such as metal layers. Thus, the present process should not be limited to the examples and illustrative methods provided herein.

In the cleaning stage, cleaning gas is added to the etchant gas so that the etchant residue formed on chamber surfaces during etching is substantially entirely removed by the end of the etching process. In a preferred embodiment, the etchant gas comprises one or more of $Cl_2$, $N_2$, $O_2$, HBr, or He—$O_2$; and the cleaning gas comprises inorganic non-hydrocarbon containing fluorinated gas such as one or more of $NF_3$, $CF_4$, or $SF_6$. Preferably, the volumetric flow ratio of cleaning gas to etchant gas is selected to remove substantially the entire etchant residue from the chamber surfaces upon completion of the etching process. More preferably, the volumetric flow ratio of cleaning gas to etchant gas is selected to remove substantially all the etchant residue formed during processing of at least 2000 substrates in the chamber, without performing a separate cleaning step for cleaning the chamber. A suitable volumetric flow ratio of cleaning gas to etchant gas is from about 1:20 to about 1:1, and more preferably from about 1:10 to about 2:3, and most preferably about 2:3. It has been discovered that at these volumetric flow ratios substantially all the etchant residue on the chamber surfaces are removed without eroding the chamber surfaces. In addition, it has been unexpectedly discovered that the chamber surfaces are cleaned and conditioned by the etchant and cleaning gas combination step, without requiring a separate chamber conditioning or seasoning step.

In the etching of silicon-containing layers, the addition of fluorinated cleaning gas to the etchant gas composition, makes the resultant process gas highly reactive to the silicon-containing layers and provides a high etch rate and a low etching selectivity ratio for etching an overlying polysilicon layer relative to an underlaying silicon dioxide layer. Typically, the addition of cleaning gas drops the etching selectivity ratio down to 4:1 to 6:1. In contrast, the etching selectivity ratio obtained with conventional etchant gas compositions is from 10:1 to 12:1. This causes the cleaning gas plasma to etch or damage the underlying layer when the underlayer is exposed to the plasma. This is even more of a problem when the underlayer is very thin, on the order of a few layers of atoms, and is very quickly damaged or etched through.

In the etching process, the substrate is first etched by a first process gas comprising a mixture of etchant gas and cleaning gas. The etchant gas comprises 120 sccm HBr, 30 sccm $Cl_2$, and 10 sccm He—$O_2$ (containing 30% $O_2$). The cleaning gas composition comprises $CF_4$ added to the etchant gas in a volumetric flow rate of about 25% of the total flow rate of cleaning gas, which is about 40 sccm. The inductor source power level is maintained at about 500 watts, the RF bias power level at about 100 W and a pressure of 4 mTorr, and the cathode temperature is at about 50 C. The cleaning gas throughly cleaned all the etchant residue deposits off the chamber walls during the etching process so that a separate wet cleaning step was not needed. However, it was determined that the addition of $CF_4$ cleaning gas reduced the etching selectivity ratio for etching polysilicon relative to the underlying silicon dioxide to an etching selectivity ratio of about 5:1. The relatively low etching selectivity ratio would result in rapid deterioration of the underlying layer, if the etching process was not changed prior to completion of etching of the underlayer.

During the first stage of the etching process, the endpoint detection system was programmed to detect an endpoint for etching the layer on the substrate, when etching had proceeded to near completion, i.e., with about 30 nm of polysilicon layer remaining on the substrate. When the selected characteristic waveform pattern was detected by the computer system, the first process conditions were changed to second process conditions to reduce the etching rate and increase or maximize the etching selectivity ratio for etching the polysilicon layer relative to the underlying silicon dioxide layer. The second process conditions used a second process gas comprising 120 sccm HBr and 10 sccm He—$O_2$ (without any $Cl_2$ or $CF_4$ added to the process gas) to etch the remaining 300 Å portion of the polysilicon layer. The pressure in the chamber was maintained at a much higher pressure of 55 mTorr, the inductor source power level at 900 watts, and the RF bias power level at 70 watts, to provide a higher source to bias power ratio of about 12. The second process gas composition, being absent $CF_4$ cleaning gas, provided an etching selectivity ratio for etching polysilicon relative to the underlying silicon dioxide of about 12:1, which is more than two times higher than the etching selectivity ratio obtained from the first process gas comprising both cleaning and etchant gas. This significantly reduced damage of the underlying layer on the substrate.

In another example, a substrate comprising polycrystalline silicon is etched in the first stage using a plasma of a first process gas comprising $Cl_2$, $N_2$, and $CF_4$, and optionally $O_2$. Preferably, the volumetric flow ratio of $Cl_2$, $N_2$, and $CF_4$ is selected to remove substantially all the etchant residue generated by etching at least 2000 substrates in the chamber, without performing a separate cleaning step for cleaning the chamber. The ratio of the volumetric flow ratio of $CF_4$:($Cl_2$+$N_2$) is more preferably from about 1:20 to about 1:1. Thereafter, in the second stage of the process, the flow of cleaning gas is terminated, and the substrate is processed with an etchant gas that is absent cleaning gas. The $CF_4$ gas can also be substituted with $SF_6$ or $NF_3$.

A multi-stage process can also be used to etch different layers on the substrate, and the cleaning gas is introduced in at least one of the stages to remove the etchant residue deposited on the chamber surfaces. A first layer of tungsten silicide is etched using a first process gas comprising chlorine-containing gases, for example, a mixture of chlorine and nitrogen, and optionally oxygen. Preferably, the volumetric flow ratio of chlorine to nitrogen is about 1:3 to about 1:1, and more preferably about 2:3. The pressure in the chamber is maintained at 1 to 10 mTorr, the inductor coil source power level at 200 to 800 Watts, and the process electrodes R.F. bias power level at 20 to 120 watts.

In the second etching stage, a second process gas is introduced into the chamber and a plasma is formed to etch a second layer, such as a polysilicon layer, below the tungsten suicide layer, after the tungsten silicide layer has been completely etched. The polysilicon layer can be etched in more than one etching process step, with the etchant gas composition being changed during each etching step. Suitable second process gas compositions comprise $Cl_2$ in a flow rate of from 20 to 120 sccm, HBr at about 80 to 240 sccm, and He—$O_2$ at about 2 to 10 sccm. The chamber pressure is from about 25 to 200 mTorr. The power level of the source current applied to the inductor antenna is from about 200 to 800 Watts, and the bias RF power level of the voltage applied to the process electrodes is from about 20 to 120 Watts.

In one or more of the first and second stages, a cleaning gas is added to the etchant gas in a volumetric ratio selected so that the etchant residue formed in any one of the stages is substantially entirely removed during the etching process. The etchant residue formed in the first and second stages typically comprises polymeric organic compounds containing halogen, carbon, hydrogen, and oxygen. When silicon-containing layers are being etched, the etchant residue comprises predominantly silicon dioxide compounds formed during etching of both the tungsten silicide and polysilicon layers on the substrate. However, the composition of etchant residue can vary from the first to the second layer, the first etchant residue composed more of W and Si species, and the second etchant residue composed more of Si and O species.

Thus the cleaning gas is added to the process gas in the first or second stage, in a volumetric ratio suitable for removing the first etchant residue formed in the first etching stage in which the tungsten silicide layer was etched, as well as the second etchant residue formed during the second etching stage in which the polysilicon layer was etched. A suitable volumetric flow ratio of cleaning gas to etchant gas is from about 1:10 to about 2:3. For example, to a flow rate of first etchant gas of about 80 sccm $Cl_2$ and 40 sccm $N_2$, was added a cleaning gas comprising $CF_4$ at a flow rate of 80 sccm, to provide a volumetric ratio of cleaning gas to first etchant gas of about 2:3.

The cleaning process removes substantially all the etchant residue formed in processing over 2000 substrates. In one experiment, over 3000 substrates of silicon wafers having an underlayer of 1000 Å of $SiO_2$, covered by a polycide layer comprising 3000 Å of polysilicon and 3000 Å of $WSi_x$, were sequentially etched in the etching chamber, and the properties of the etched features, etching rates, and etching selectivity ratios measured for selected wafers. The tungsten silicide layer was etched using a first process gas comprising etchant gas of 80 sccm $Cl_2$ and 40 sccm $N_2$, and cleaning gas of 80 sccm $CF_4$, which provides a volumetric flow ratio of cleaning gas to etchant gas of about 2:3. The pressure in the chamber was maintained at 4 mTorr, the inductor coil source power level was set at 600 Watts and the R.F. bias power level at 60 watts.

The polysilicon layer on the substrate was etched in two stages, including a main etch stage and an "overetch" stage, in order to stop the etching process without etching through the silicon dioxide underlayer on the substrate. The main etch stage was stopped by the endpoint detection system, immediately before the polysilicon layer was completely etched through, and an overetch stage performed to etch through the residual portion of the polysilicon layer. In the main etching stage, the polysilicon layer was etched using an etchant gas comprising 60 sccm $Cl_2$, 140 sccm HBr, and 5 sccm He—$O_2$; the power level of the source current applied to the inductor antenna was at 480 Watts, and the bias RF power level of the voltage applied to the process electrodes was 64 Watts.

In the overetch stage, the halogen content of the etchant gas was reduced to obtain slower and more controllable etch rates. For example, In the over-etching process stage, the etchant gas comprised 90 sccm HBr and 5 sccm He—$O_2$; a chamber pressure of 50 mTorr; a source power level of 400 Watts; and a RF bias power level of 140 Watts, to reduce etching rates. The present etching and simultaneous etching process provided consistently high tungsten silicide etch rates of 3000 Å/min, polysilicon etch rates of about 2350 Å/min, and a low variation in etch rate during continuous etching of 3000 wafers without cleaning the chamber. In addition, the tungsten silicide etch rate varied by less than 8% and the polysilicon etch rate varied by less than 2%.

The etching process of the present invention has been found to uniformly etch substrates while simultaneously removing etchant residues deposited on the chamber during the etching process, irrespective of the thickness or chemical stoichiometry of the etchant residue layers. Prior art etching processes required cleaning and conditioning of the chamber after processing of only 200 to 300 wafers, because of the variation in etching rates and etching selectivity ratio and the higher particle contamination levels that resulted from etchant residue deposits on the chamber surfaces, after processing this number of wafers. Also, prior art cleaning processes, particularly those performed by an operator, often fail to uniformly clean and remove the etchant residue deposits formed on chamber surfaces, and such build-up of etchant deposits resulted in flaking off and contamination of the substrate.

In contrast, the process of the present invention removes etchant residues formed across substantially all of the chamber surfaces, to reduced contamination and increase substrate yields. The cleaning gas also results in much less erosive damage to the chamber compared to conventional in-situ plasma cleaning steps, because of the reduced energy levels of the plasma in the etching chamber. This was difficult to accomplish in prior art processes, in which high powered plasmas used to remove the residue deposits also resulted in extensive erosion of chamber surfaces and components. By reducing the need to replace chamber components, the cost of operating the chamber and the cost per substrate are significantly reduced. Furthermore, the activated cleaning gas can be used to efficiently clean a chamber in-situ during etching of substrates, rather than stopping processing to wet clean the chamber walls and components, thereby increasing etching throughput and further reducing costs per substrate. The etching and cleaning process is expected to increase chamber lifetimes by a factor of at least 2, and also increase substrate yields by reducing the deposition of flaked-off etchant byproducts onto the substrate.

The present invention is described with reference to certain preferred versions thereof; however, other versions are possible. For example, the treatment and cleaning process of the present invention can be used for treating chambers for other applications, as would be apparent to one of ordinary skill. For example, the process can be applied, as would be apparent to one of ordinary skill in the art, to treat sputtering chambers, ion implantation chambers, or deposition chambers, or in combination with other cleaning process. Therefore, the spirit and scope of the appended claims should not be limited to the description of the preferred versions contained herein.

What is claimed is:

1. A method of etching a layer on a substrate substantially without etching or damaging an underlayer, the method comprising the steps of:
   (a) placing the substrate in a process zone;
   (b) providing in the process zone, an energized process gas comprising etchant gas and cleaning gas, to etch the layer on the substrate;
   (c) detecting an etching endpoint immediately prior to etching through the entire layer on the substrate; and
   (d) changing the composition of the process gas to remove the cleaning gas, to etch the remaining portion of the layer substantially without damaging the underlayer.

2. A method according to claim 1 wherein the etchant gas comprises one or more of $Cl_2$, HBr, $N_2$, $O_2$ or He—$O_2$; and wherein the cleaning gas comprises one or more of $NF_3$, $CF_4$, or $SF_6$.

3. A method according to claim 2 wherein the volumetric flow ratio of cleaning gas to etchant gas is selected to remove the etchant residue formed during etching of at least 2000 substrates in the chamber, without performing a separate cleaning step for cleaning the etching chamber.

4. A method according to claim 3 wherein the volumetric flow ratio of cleaning gas to etchant gas is from about 1:20 to about 1:1.

5. A method according to claim 1 wherein the etching endpoint is detected by the steps of:
   (1) directing radiation onto the layer on the substrate;
   (2) measuring the intensity of reflected radiation over time to obtain a measured waveform pattern; and
   (3) comparing the measured waveform pattern to a predetermined waveform pattern to determine the etching endpoint.

6. A method of processing a substrate while simultaneously cleaning a process chamber, the method comprising the steps of:
   (a) placing a substrate having a layer, into the process chamber;
   (b) in one process stage, providing an energized process gas into the process chamber to etch the layer on the substrate;
   (c) in another process stage, providing another energized process gas into the process chamber to etch the layer on the substrate; and
   (d) during at least one of the process stages, measuring the intensity of radiation reflected from the layer on the substrate to determine a measured waveform pattern, comparing the measured waveform pattern to a predetermined waveform pattern, and changing from one process stage to another process stage, when the measured waveform pattern is substantially the same as the predetermined waveform pattern, wherein the process gas in one of step (b) or (c) comprises a cleaning gas in a volumetric ratio sufficiently high to remove etchant residue deposited on process chamber surfaces.

7. A method according to claim 6 wherein the cleaning gas comprises one or more of $NF_3$, $CF_4$, or $SF_6$.

8. A method of simultaneously etching a substrate and cleaning an etching chamber, the method comprising the steps of:
   (a) placing the substrate in the etching chamber, the substrate comprising a silicon-containing layer comprising elemental silicon or silicon compounds;
   (b) providing energized process gas to the etching chamber to etch the silicon-containing layer on the substrate and simultaneously clean the etchant residue formed on chamber surfaces, the energized process gas comprising etchant gas selected from the group consisting of $Cl_2$, HBr, $N_2$, $O_2$, and He—$O_2$, and cleaning gas selected from the group consisting of $NF_3$, $CF_4$, and $SF_6$, the volumetric flow ratio of etchant gas to cleaning gas being selected to remove etchant residue formed on the chamber surfaces upon completion of the etching process;
   (c) during step (b), measuring an intensity of radiation reflected from the silicon-containing layer on the substrate to determine a measured waveform pattern; and
   (d) changing process conditions to remove the cleaning gas when the measured waveform pattern is substantially similar to a predetermined characteristic waveform pattern.

9. A method according to claim 8 wherein in step (b) the process gas comprises $Cl_2$, $N_2$, and $CF_4$ in a volumetric flow ratio selected to remove substantially all the etchant residue formed during etching of at least 2000 substrates in the chamber, without performing a separate cleaning step for cleaning the chamber in between etching of the 2000 substrates.

10. A method according to claim 9 wherein the volumetric flow ratio of $CF_4$:($Cl_2$+$N_2$) is from about 1:20 to about 1:1.

11. A method of processing a substrate in a chamber, the method comprising the steps of:
   (a) placing the substrate into the chamber, the substrate having a layer;
   (b) processing the layer on the substrate;
   (c) during step (b), monitoring an intensity of radiation reflected from the layer on the substrate, over time, to obtain a waveform;
   (d) recognizing a characteristic feature of the waveform that occurs before the layer on the substrate is completely processed; and
   (e) changing a process condition when the characteristic feature is recognized.

12. A method according to claim 11 wherein the step of changing a process condition comprises changing a rate of processing of the layer on the substrate.

13. A method according to claim 11 wherein the characteristic feature comprises a waveform shape.

14. A method according to claim 13 wherein the waveform shape is a small dip before a large peak.

15. A method according to claim 13 wherein the waveform shape is independent of the number of maxima or minima in the waveform.

16. A method according to claim 13 wherein the waveform shape comprises a curved portion.

17. A method according to claim 13 wherein step (c) comprises the step of monitoring the intensity of radiation having substantially a single wavelength.

18. A method according to claim 13 wherein step (c) further comprises the step of providing radiation comprising substantially only non-polarized light, on the substrate.

19. A method according to claim 11 wherein step (d) comprises recognizing a characteristic waveform shape that occurs immediately prior to a terminal peak or dip in the waveform, the terminal peak or dip corresponding to completion of a stage of processing of the layer.

20. A method according to claim 11 wherein the step of changing a process condition comprises terminating the processing of the layer on the substrate.

21. A method according to claim 20 comprising during step (b), adding a cleaning gas to the chamber in a volumetric ratio sufficiently high to clean a surface of the chamber.

22. A method of processing a substrate in a chamber, the method comprising the steps of:
(a) placing the substrate into a chamber, the substrate having a layer;
(b) processing the layer on the substrate;
(c) during step (b), monitoring an intensity of radiation reflected from the layer on the substrate to determine a waveform;
(d) evaluating the waveform to recognize a characteristic shape; and
(e) changing a process condition when the characteristic shape is recognized.

23. A method according to claim 22 wherein the characteristic shape is a small dip before a large peak.

24. A method according to claim 22 wherein the characteristic shape is independent of the number of maxima or minima in the waveform.

25. A method according to claim 22 wherein the characteristic shape occurs immediately prior to a terminal peak or dip in the determined waveform, the terminal peak or dip corresponding to completion of a stage of processing of the layer.

26. A method of etching a layer on a substrate substantially without etching or damaging an underlayer, the method comprising the steps of:
(a) placing the substrate in a process zone, and maintaining first process conditions in the process zone to etch the layer on the substrate; and (b) monitoring an intensity of radiation reflected from the layer, and upon recognizing a characteristic feature comprising a change in intensity of the reflected radiation, changing the first process conditions to second process conditions to change a rate of etching of the layer or change an etching selectivity ratio of etching the layer relative to the underlayer, before the entire layer is etched through.

27. A method according to claim 26 wherein the second process conditions comprise process conditions that reduce or stop etching of the layer.

28. A method according to claim 27 wherein the first process conditions are changed to second process conditions when the layer has a thickness of about 200 angstroms to about 1000 angstroms.

29. A method according to claim 26 further comprising the initial steps of providing radiation onto a layer on a test substrate while etching the test substrate, measuring the intensity of reflected radiation to obtain a measured waveform, and determining a characteristic feature of the measured waveform that is obtained at a particular stage of the etching process.

30. A method according to claim 26 wherein the characteristic feature comprises a waveform shape occurring immediately prior to a terminal peak or dip in the measured waveform, the terminal peak or dip corresponding to a completed stage of etching of the layer.

31. A method according to claim 26 wherein the first process conditions include providing a first process gas comprising etchant gas for etching the substrate and cleaning gas for cleaning etchant residue formed on the chamber surfaces during etching of the substrate and wherein the second process conditions include providing a second process gas comprising etchant gas that is substantially absent the cleaning gas.

32. A method according to claim 31 wherein the etchant gas comprises one or more of $Cl_2$, $HBr$, $N_2$, $O_2$, or $He-O_2$; and the cleaning gas comprises one or more of $NF_3$, $CF_4$, or $SF_6$.

33. A method according to claim 31 further comprising the step of selecting a volumetric flow ratio of cleaning gas to etchant gas that removes the etchant residue formed during etching of at least 2000 substrates in the chamber, without performing a separate cleaning step for cleaning the etching chamber.

34. A method according to claim 33 wherein the volumetric flow ratio of cleaning gas to etchant gas is from about 1:20 to about 1:1.

* * * * *